United States Patent [19]

Ishii et al.

[11] Patent Number: 5,396,176
[45] Date of Patent: Mar. 7, 1995

[54] COMBUSTION CONDITION DIAGNOSIS UTILIZING MULTIPLE SAMPLING OF IONIC CURRENT

[75] Inventors: Toshio Ishii, Mito; Takashi Mukaihira, Katsuta, both of Japan

[73] Assignee: Hitachi, Ltd., Tokyo, Japan

[21] Appl. No.: 955,147

[22] Filed: Sep. 29, 1992

[30] Foreign Application Priority Data

Sep. 30, 1991 [JP] Japan .................. 3-251231

[51] Int. Cl.⁶ .............................................. F02P 17/00
[52] U.S. Cl. ....................... 324/388; 324/399; 123/479
[58] Field of Search ............... 324/378, 380, 388, 391, 324/399; 123/425, 435, 479

[56] References Cited

U.S. PATENT DOCUMENTS

| | | | |
|---|---|---|---|
| 4,547,734 | 10/1985 | Spaude | 324/395 |
| 4,862,093 | 8/1989 | Jiewertz | 324/464 |
| 4,918,389 | 4/1990 | Schleupen et al. | 324/399 |
| 4,987,771 | 1/1991 | Iwata | 73/117.3 |
| 5,017,874 | 5/1991 | Di Nunzio et al. | 324/378 |
| 5,067,462 | 11/1991 | Iwata et al. | 123/425 |
| 5,178,001 | 1/1993 | Ikeuchi et al. | 324/459 X |
| 5,215,067 | 6/1993 | Shimasaki et al. | 324/388 |
| 5,221,904 | 6/1993 | Shimasaki et al. | 324/388 |
| 5,226,394 | 7/1993 | Shimasaki et al. | 324/388 |
| 5,237,279 | 8/1993 | Shimasaki et al. | 324/391 |

*Primary Examiner*—Kenneth A. Wieder
*Assistant Examiner*—Christopher M. Tobin
*Attorney, Agent, or Firm*—Antonelli, Terry, Stout & Kraus

[57] ABSTRACT

An apparatus for combustion condition diagnosis has an ionic current detecting circuit for measuring a voltage at the secondary side of the ignition coil of an engine during a plurality of time periods during one operation cycle including a period in which an internal pressure of a cylinder of the engine becomes maximum, under a normal combustion condition. A window generation circuit is provided for establishing the time periods, an integration circuit is provided for integration processing of the measured voltage during each time period, a ROM stores a list indicating combustion condition corresponding to the integrated value for the each time period, and a CPU diagnoses the combustion condition based on the integrated value for the each time period and the list of combustion conditions, in order to decrease erroneous judgement and perform more adequate combustion condition diagnosis.

22 Claims, 8 Drawing Sheets

(a) PRIMARY COIL VOLTAGE (b) SECONDARY COIL VOLTAGE 
SPARKING (c) NORMAL COMBUSTION 
IONIC CURRENT (d) NOISELESS DISCHARGE FUEL SHORTAGE (e) NO CHANGE IN PRIMARY COIL VOLTAGE (f) KNOCKING (g) SOOTY CONDITION

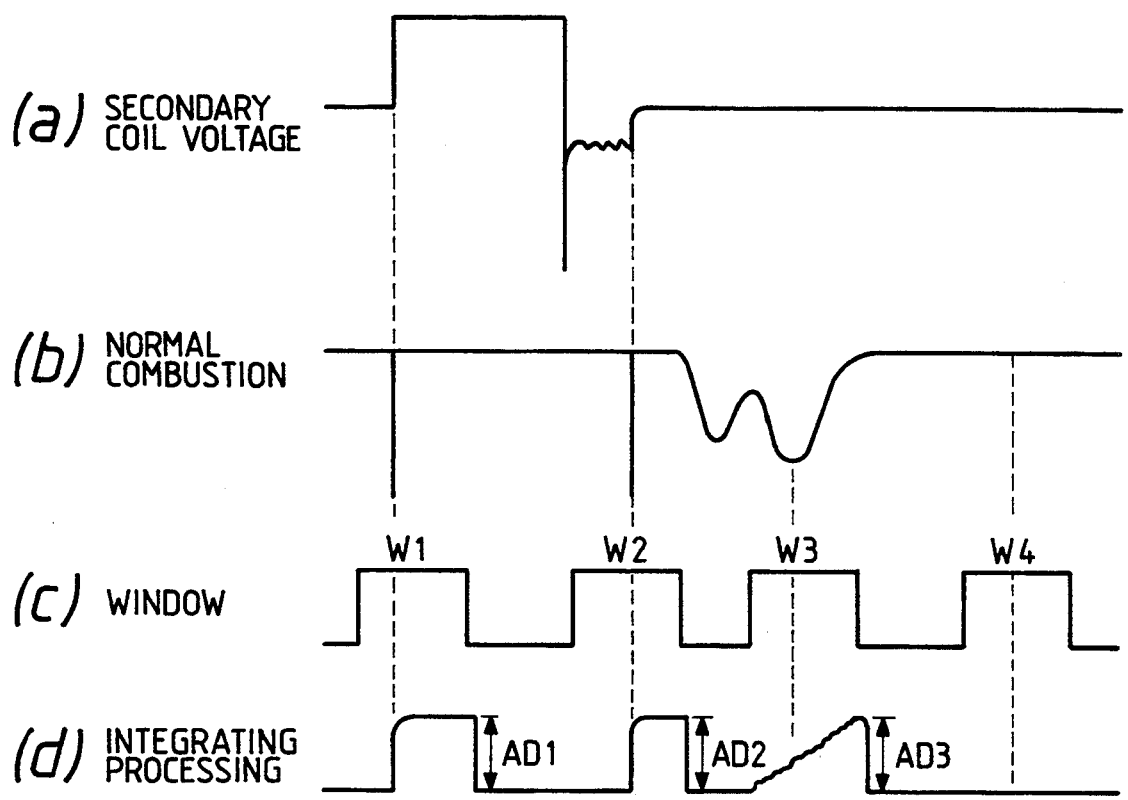

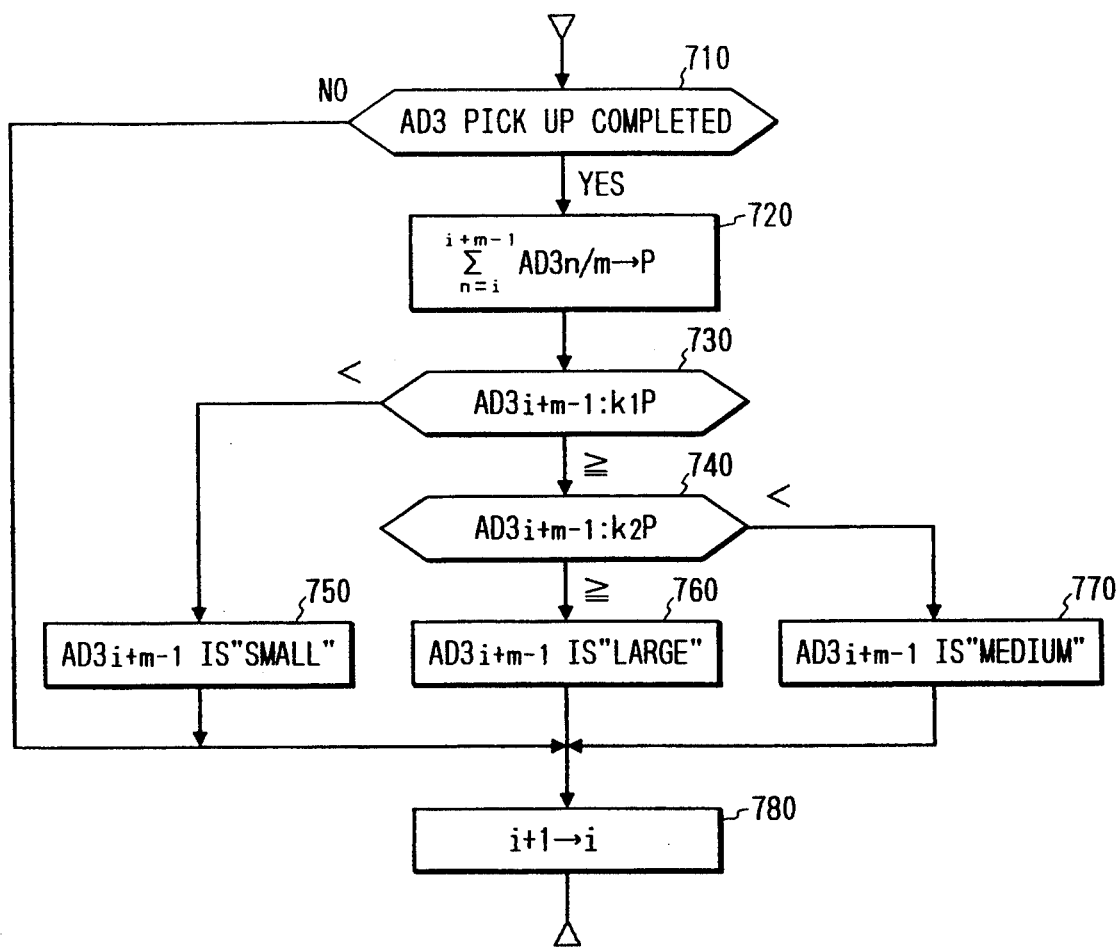

COMBUSTION CONDITION DIAGNOSIS UTILIZING MULTIPLE SAMPLING OF IONIC CURRENT

BACKGROUND OF THE INVENTION

The present invention relates to a method and apparatus for diagnosis of a combustion condition in an internal combustion engine and a control apparatus provided therewith.

An example of a conventional apparatus for combustion diagnosis is disclosed in JP-A-2-104978 (1990).

In accordance with the known apparatus for combustion diagnosis, judgement as to whether misfire is occurring or not is performed by detecting an electric current after a constant voltage is supplied to an ignition plug subsequent to sparking of the ignition plug. When the ignition plug sparks, the atmosphere around the ignition plug is ionized; and, accordingly, if a voltage is applied to the ignition plug, an electric current, that is an ionic current, flows between the contacts of the ignition plug. The ionic current is measured for a predetermined period as a sample, and the sample is compared with a predetermined current level for judging whether misfire is occurring or not. However, in accordance with the prior art, the diagnosis of the combustion condition is performed by comparison of an ionic current, which is measured at only one sampling time, with a predetermined current level, and, consequently, the prior art has a problem that judgement errors occur relatively frequently.

SUMMARY OF THE INVENTION

The present invention is aimed at resolution of the above described problem which is characteristic of the prior art, and the main object of the present invention is to provide a method of combustion condition diagnosis which is able to reduce the frequency of occurrence of judgement errors, and a combustion controller for performing combustion control depending on results obtained by the above described method of combustion condition diagnosis.

The apparatus for combustion condition diagnosis, which serves to realize the objects of the present invention, is characterized by provision of:

a voltage charging means for applying a predetermined voltage to an ignition plug or other electrodes in a combustion chamber at least immediately after sparking of the ignition plug;

a measuring means for supplying a voltage or electric current at the ignition plug to which the predetermined voltage, during each of a plurality of spaced time periods including a time period in which the internal pressure of the cylinder becomes maximum under a normal combustion condition;

a feature extracting means for extracting a feature of the voltage or the electric current sampled in each of the above described time periods;

a memory means for storing a list of combustion conditions corresponding to the above described feature in each of the above described time periods or combinations thereof; and a combustion condition judging means for judging the combustion condition in the cylinder based on the above described features extracted in each of the above described time periods and the above described list of combustion conditions.

The apparatus for combustion condition diagnosis in accordance with the present invention is characterized by provision of:

a voltage charging means for applying a predetermined voltage to an ignition plug immediately after sparking of the ignition plug;

a measuring means for sampling a voltage on the secondary side of the ignition coil connected to the above described ignition plug, and the other electrodes in the combustion chamber during a plurality of time successive periods including a time period in which the internal pressure of a cylinder becomes maximum in a normal combustion condition and a time period in which the application of voltage to the primary side of the ignition coil is initiated;

a feature extracting means for extracting a feature of the voltage measured in each of the above described time periods;

a memory means for storing a list of combustion conditions corresponding to the above described feature in each of the above described time periods or combinations thereof; and a combustion condition judging means for judging the combustion condition in the cylinder based on the above described features extracted in each of the above described time periods and the above described list of combustion conditions.

In the above described apparatus, the plurality of time periods preferably include a time period in which the sparking is terminated under a normal combustion condition, and/or a time period in which a predetermined time has elapsed after the time when internal pressure of the cylinder becomes maximum under a normal combustion condition.

Besides, as for the above described feature, values of voltage or electric current larger than a predetermined value, the maximum value, the minimum value, and the average value etc. may be usable, but it is preferable to use an integrated value of voltage or electric current during the above described period. Further, another apparatus for combustion condition diagnosis to realize the above objects may have a combustion condition judging means for judging various combustion conditions of engines characterized by provision of:

a memory means for separately storing frequencies of various combustion conditions judged by the combustion condition judging means depending on various kinds of combustion conditions; and a display means for indicating a judging result on the frequency of larger values of the feature than a predetermined value or a value calculated by a predetermined function assigned for each kind of combustion condition among the frequencies for each of the combustion conditions.

When a predetermined voltage is applied to an ignition plug or another electrode which is installed in the combustion chamber immediately after discharge of the ignition plug, if the fuel ignites, atmospheric gas in the vicinity of the ignition plug is ionized, and an ionic current flows at that portion between the contacts.

If the combustion is normal, the voltage or the electric current at the ignition plug, and the connected secondary side ignition plug, during the time period when the internal pressure becomes maximum and other time periods, can be measured by the measuring means. During the time period when the internal pressure becomes maximum, the ionic current flows if the combustion is normal. Accordingly, the determination whether a misfire occurs or not can be substantially performed by measuring the ionic current during this time period.

In accordance with the present invention, the combustion condition can be determined more accurately by comprehensively judging the results of measuring voltages or electric currents in a plurality of successive time periods because the voltages and the electric currents are measured in other time periods in addition to the above described time period.

Further, by measuring the voltages and the electric currents in the other time periods, diagnosis of the combustion condition other than whether misfire occurs or not becomes possible. For example, diagnosis as to whether "smoldering" or not can be performed by measuring the voltage or the electric current during a time period including the time elapsed during a predetermined period after the time when the internal pressure of the cylinder becomes maximum under the normal combustion condition. That means, when smoldering occurs, the combustion continues for a while after the fuel ignition and the ionic current flows during the continued combustion. Accordingly, the smoldering can be determined by measuring the ionic current during the time of continued combustion.

In case of an apparatus having a memory means for storing data, frequencies of various kinds of combustion conditions judged by the combustion condition judging means are stored separately depending on each kind of combustion condition. The display means for the judging results relating to frequencies of the each combustion conditions indicates the judging results on frequencies of larger values of the feature than a predetermined value or a value calculated by a predetermined function assigned for each kind of combustion condition among the frequencies of the combustion conditions. Accordingly, even if some erroneous judgement is eventually performed, the output of the erroneous judgement can be mostly eliminated.

BRIEF DESCRIPTION OF THE DRAWINGS

FIG. 9(a) to FIG. 9(d) are drawings for explanation of integration processing relating to an embodiment of the present invention;

FIG. 10 is a flow chart indicating a routine for combustion condition diagnosis relating to an embodiment of the present invention; and FIG. 11 is a drawing indicating a list of combustion condition judgements relating to an embodiment of the present invention.

DETAILED DESCRIPTION OF THE PREFERRED EMBODIMENTS

An embodiment of the present invention will explained with reference to the drawings.

Figure 1:
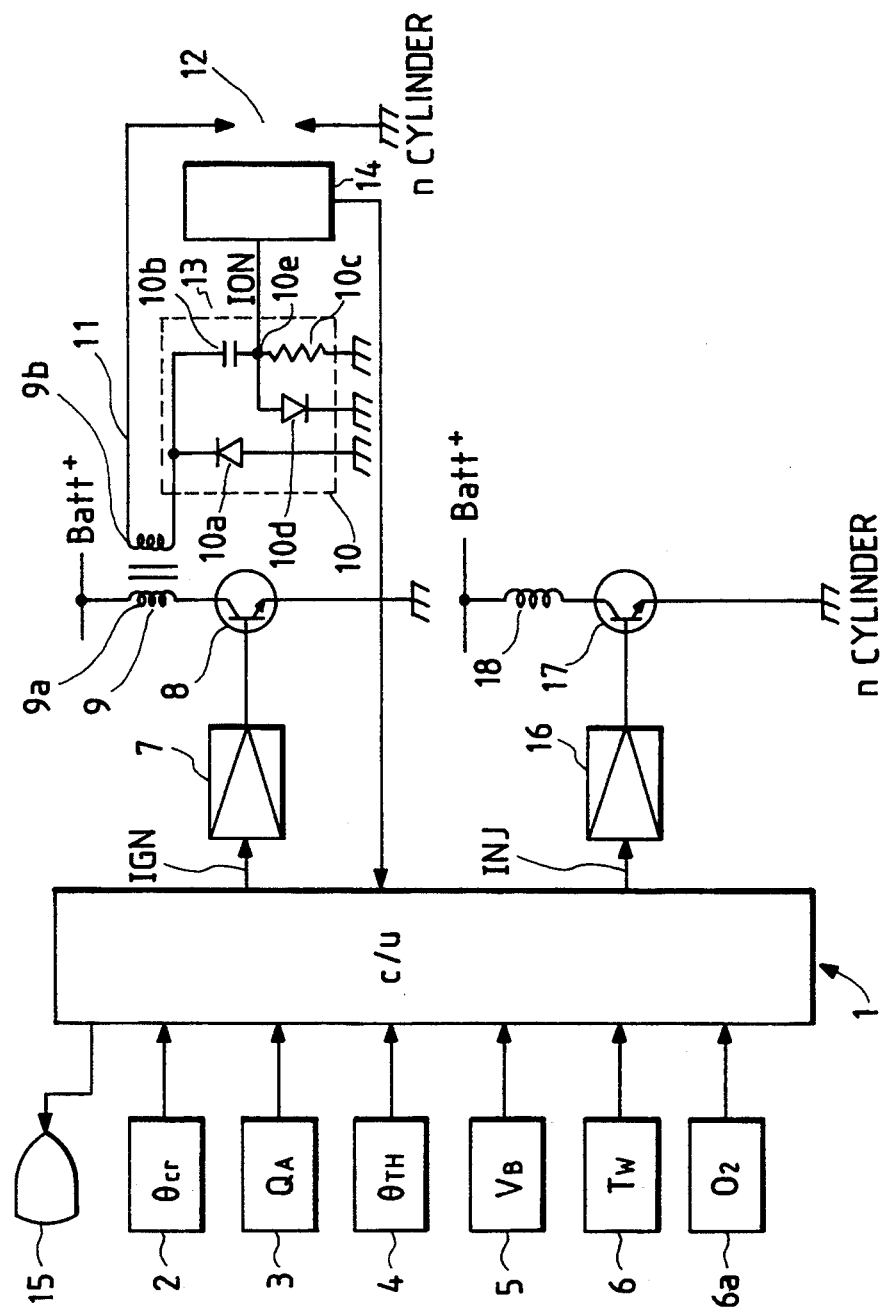
FIG. 1 is a schematic diagram of an apparatus for combustion condition diagnosis relating to an embodiment of the present invention.

In a normal ignition process, as seen in FIG. 1, an ignition timing signal IGN from the control unit 1 is put out to the power transistor 8 through the signal amplifier 7; and, when the power transistor 8 is switched OFF in accordance with the ignition timing signal IGN, high cut-off voltage corresponding to the discharge current is generated at the secondary side of the ignition coil 9 and the ignition plug 12 sparks.

In a fuel injection process, a fuel injection signal INJ from the control unit 1 is put out to the power transistor 17 through the signal amplifier 16; and, when the power transistor 17 is switched ON in accordance with the fuel injection signal INJ, the magnetic coil 18 for injection is activated and a plunger, which is not shown in the Figure, operates to inject fuel into an ignition chamber.

An apparatus for combustion condition diagnosis of the present embodiment comprises as illustrated in FIG. 1, the control unit 1, the ionic current detecting circuit 10 installed at the secondary side of the ignition coil 9, the processing circuit 14 for effecting integration process on the output signals from the ionic current detecting circuit 10, and the display apparatus 15 for indicating results of the combustion condition diagnosis.

Figure 2:
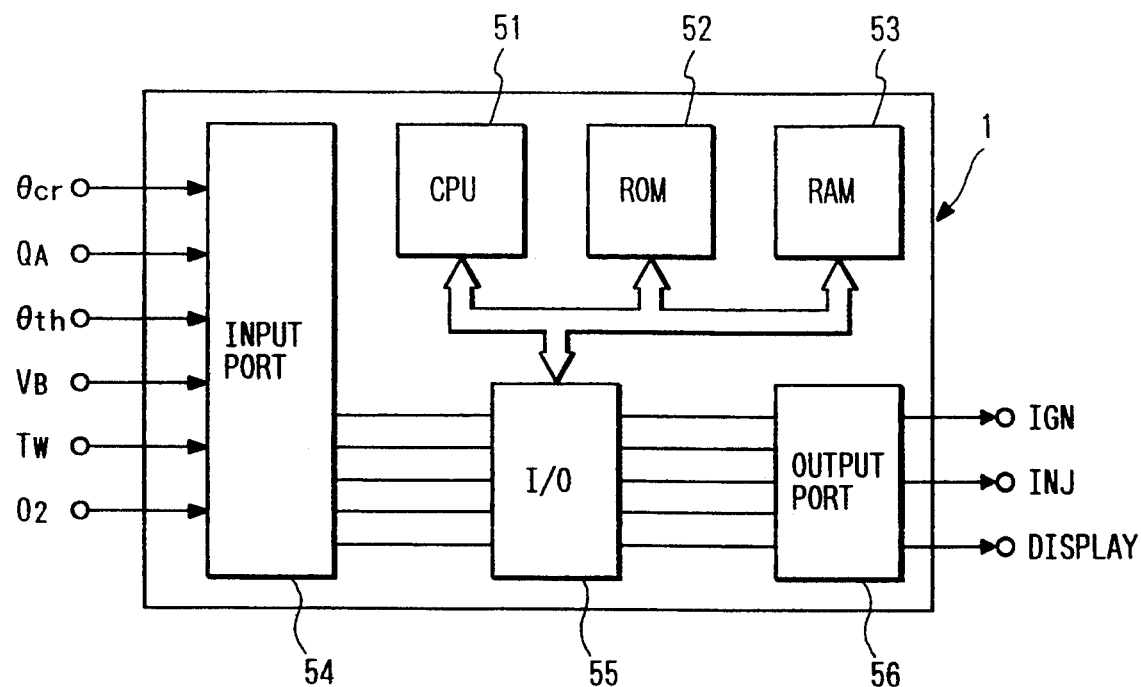
FIG. 2 is a block diagram of a control unit for an apparatus for combustion condition diagnosis relating to an embodiment of the present invention.

The control unit 1 comprises, as illustrated in FIG. 2, the CPU 51 for performing various calculations, the ROM 52 and the RAM 53 for storing programs for the processings performed by the CPU 51 and the list of combustion conditions indicated in FIG. 11, the input port 54 for inputting various signals, the input/output controller (I/O) 55, and the output port 56 for outputting various signals.

The input port 54 of the control unit 1 receives crank angle signals $\theta$cr from the crank angle sensor 2, air flow signals Qa from the air flowmeter 3, which measures the air flow rate of air supplied to the engine, throttle valve opening signals $\theta$th from the throttle valve opening sensor 4, a power source voltage Vb from the battery 5, water temperature signals Tw from the water temperature sensor 6, which measures the temperature of the water in the radiator, and oxygen concentration signals $O_2$ from the oxygen sensor 6a, which measures the oxygen concentration in the exhaust pipes etc. And, from the output port 56 there is supplied the ignition timing signals IGN, the fuel injection signals INJ, and signals to the display apparatus 15 etc.

The ionic current detecting circuit 10 comprises, as indicated in FIG. 1, the Zener diode 10a for controlling secondary voltage of the ignition coil 9, the condenser 10b for storing the electric charge on the secondary side ignition coil 9b when the ignition plug 12 sparks, and the resistance 10c and diode 10d which are connected between the condenser 10b and ground.

Figure 3:
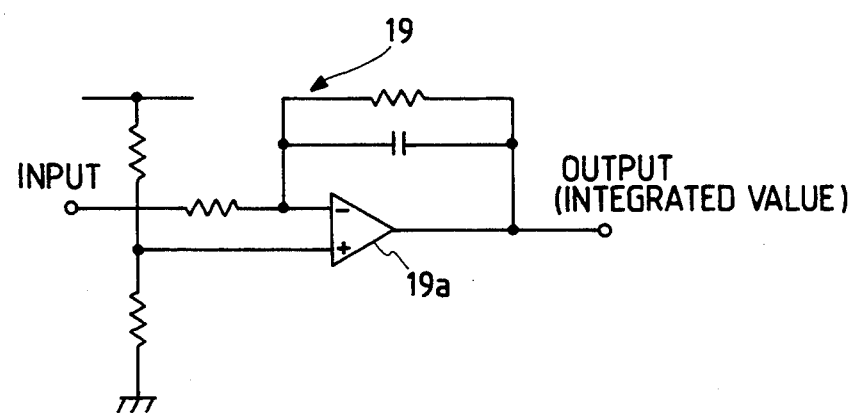
FIG. 3 is a circuit diagram of an integration circuit relating to an embodiment of the present invention.
Figure 4:
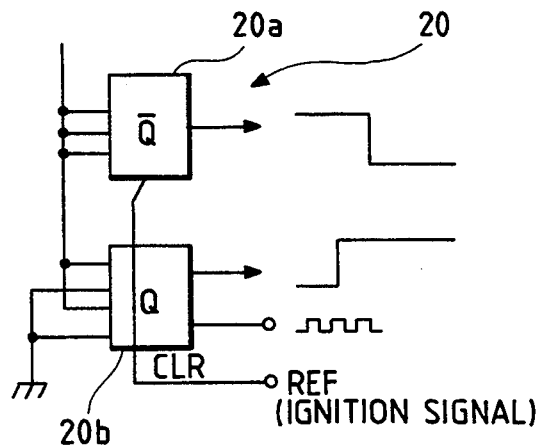
FIG. 4 is a circuit diagram of a window generation circuit relating to the present invention.

The processing circuit 14 comprises, as indicated in FIGS. 3 and 4, the integration circuit 19 for integration processing of signals from the output terminal 10e of the ionic current detecting circuit 10, and the window generation circuit 20 for generation of windows for sampling signals from the output terminal 10e of the ionic current detecting circuit 10. The integration circuit 19 is provided with the amplifier 19a for integration processing of signals from the output terminal 10e of the ionic current detecting circuit 10. Further, the window generation circuit 20 is provided with the flip-flop circuits 20a and 20b for generating wave shapes having mutually different timings. The window generation circuit 20 generates windows by combining outputs from the flip-flop circuits 20a and 20b.

Figure 5:
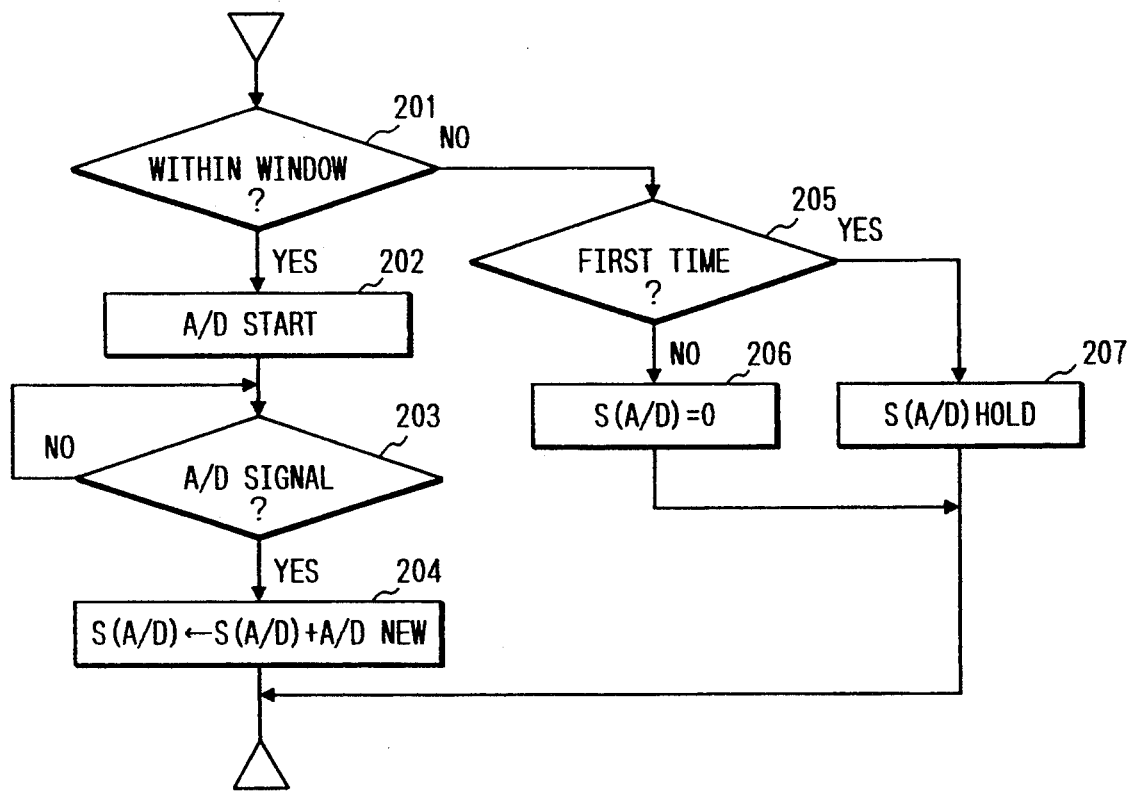
FIG. 5 is a flow chart indicating a routine for processing of signals from an ionic current detecting circuit relating to an embodiment of the present invention.

Although the operation of the processing circuit 14 can be performed with the above described hardware arrangement, the operation also can be implemented in software. That is, as indicated by the flow chart in FIG. 5, it is judged initially whether the signal is within the window or not at the step 201, and subsequently, if the signal is within the window, analog to digital (A/D) conversion of the signal from the output terminal 10e of the ionic current detecting circuit 10 is started at the step 202. The completion of the A/D conversion is confirmed at the step 203. After the A/D conversion is completed, the converted values are summed by a sum-up counter for obtaining an integrated value S(A/D) at the step 204. If the signal is determined to be outside of the window at the step 201, the processing goes to the step 205 where it is judged whether the input signal is occurring for the first time. When the signal appears for the first time, the value S(A/D) of the sum-up counter is kept in a condition of HOLD at the step 207. When the signal is not appearing for the first time, the value S(A/D) of the sum-up counter is reset to zero (S(A/D)=0) at the step 206.

In the manner above described, the operation of the processing circuit 14 can be performed under control of software. Accordingly, the processing circuit 14 is not necessarily required in the case where programs for the above described operation are registered in the ROM 52 of the control unit 1 and the program is executed by the CPU 51 in response to the signal received from terminal 10e.

In the present embodiment, the means for charging an electric voltage is composed of the condenser 10b, the measuring means is composed of the ionic current detecting circuit 10 and the processing circuit 14, and the feature extracting means is composed of the processing circuit 14. Further, the memory means for storing a list of combustion conditions is composed of the ROM 52 in the control unit 1, and the means for combustion condition judgement is composed of the CPU 51 and the ROM storing programs for operation of the CPU 51.

Next, operation of the preferred embodiment is explained.

Figure 8:
FIG. 8(a) to FIG. 8(g) are voltage wave shape drawings indicating a voltage wave shape at each of the portions of an apparatus for combustion condition diagnosis relating to an embodiment of the present invention.
Figure 8:
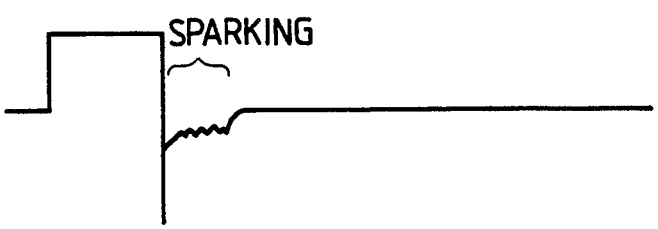
Figure 8:
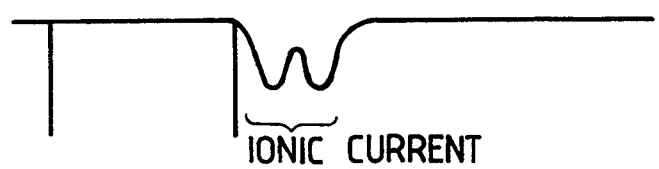
Figure 8:
Figure 8:
Figure 8:
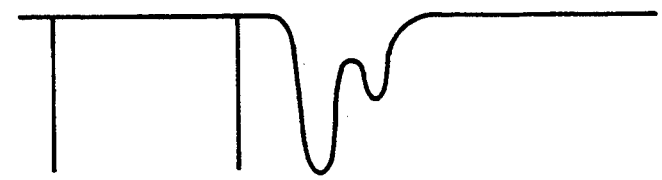
Figure 8:

When an ignition timing signal IGN from the control unit 1 is supplied to the power transistor 8 through the signal amplifier 7, a voltage as indicated in FIG. 8(a) is generated at the primary side coil 9a. Correspondingly, a voltage as indicated in FIG. 8(b) is generated at the ignition plug side 11 of the secondary coil 9b. When the power transistor 8 is switched OFF and electric current at the primary coil 9a is cut off, an electromotive force is generated at the secondary coil 9b and the ignition plug 9 sparks for a predetermined period. With the sparking, an electric current flows from the ground side of the ignition plug 12 to the secondary side of the ignition coil 9, and is stored in the condenser 10b of the ionic current detecting circuit 10. In the ionic current detecting circuit 10, a Zener diode 10 provided. The condenser 10b is not charged to more than a predetermined voltage level because the Zener diode 10a restricts the maximum charging voltage to the predetermined voltage.

When the ignition plug 12 sparks, atmospheric gas in the vicinity of the ignition plug 12 is ionized, and electric current path is established between the plug electrodes. Accordingly, the electric charge stored in the condenser 10b during the sparking is discharged when the sparking is terminated, and an electric current flows between electrodes of the ignition plug 12. The electric current which flows through the ionization path formed by the ionized atmospheric gas in the vicinity of the ignition plug 12 is generally called an ionic current. The ionic current is detected at the output terminal 10e of the ionic current detecting circuit 10 as a voltage having wave shape illustrated in FIG. 8(c). Gas in the combustion chamber is partly ionized immediately after the sparking of the ignition plug 12, that is, only gas in the vicinity of the ignition plug 12 is ionized, and subsequently, all of the gas in the combustion chamber is ionized by the ignition of fuel. Accordingly, as shown in FIG. 8(c), two peaks appear in the voltage wave shape of the ionic current. Under a normal combustion condition, voltage wave shapes of the first transition peak and sparking termination of the secondary coil 9b voltage, in addition to the voltage wave shape of the ionic current, appear at the output terminal 10e of the ionic current detecting circuit 10, as illustrated in FIG. 8(c).

On the other hand, under an abnormal combustion condition, the voltage wave shape as illustrated in FIG. 8(c) is not detected, but voltage wave shapes such as shown in FIG. 8(d), (e), (f), and (g) appear.

That means, in a case such as misfire caused by noiseless discharge or fuel supply deficiency, the ionization phenomenon does not occur and the ionic current is not generated; accordingly, the voltage wave shape becomes similar to the one illustrated in FIG. 8(d). In a case when the primary coil voltage is not changed for the reason that the power transistor 8 does not start its operation etc., no voltage change is observed in the voltage wave shape, as illustrated in FIG. 8(e). When knocking occurs, the ionization of gas is increased by combustion before sparking of the ignition plug 12 and the level of the ionic current is increased, as illustrated in FIG. 8(f). When smoking occurs, combustion continues for a while after the sparking and the ionic current also flows for a while, as seen in FIG. 8(g).

The ionic current can be detected to some extent by measuring voltage or electric current at the ignition plug side 11 of the secondary coil 9b or the ignition plug 12, but the voltage at the ignition plug 12 when the ionic current flows is very small in comparison with the voltage at the ignition plug 12 when it sparks, and so the ionic current is not observed in FIG. 8(b). Accordingly, when the ionic current at the above described portions is measured, it is necessary to amplify the current or the voltage or to change the scale of the measurement, all of which are undesirable.

Windows are used to detect the signal from the output terminal 10e of the ionic current detecting circuit 10 by the processing circuit 14, as illustrated in FIG. 9(c), and the voltage values in the windows are integrated as illustrated in FIG. 9(d). The windows are provided with predetermined widths, which are centered on a first transition time of the secondary voltage before sparking (a starting time of primary current flow), the sparking termination time, an ionic current generation time (at the maximum internal pressure of the cylinder), and a time when ionic current is not detectable after the sparking under the normal combustion condition, respectively. As above described, only necessary voltage values are obtained by use of windows having predetermined widths, and accordingly, detection of unnecessary noises becomes less and more precise combustion diagnosis can be performed. Further, even if noise appears in the windows, the noise resistant character is enhanced because the voltage values are processed by an integration processing.

The signals processed by the processing circuit 14 for integration are applied to the control unit 1, and are used for the combustion condition diagnosis. The combustion condition diagnosis is performed by the CPU 51 based on a list of combustion conditions (shown in FIG. 11) which is stored in the ROM 52.

For example, referring to FIG. 11, when the integrated value AD1 at the window W1 is LARGE, the integrated value AD2 at the window W2 is LARGE, the integrated value AD3 at the window W3 is MEDIUM, and the integrated value AD4 at the window W4 is SMALL, the combustion condition is judged as a normal combustion condition. When the integrated value AD1 at the window W1 is LARGE, the integrated value AD2 at the window W2 is LARGE, the integrated value AD3 at the window W3 is SMALL, and the integrated value AD4 at the window W4 is SMALL, the combustion condition is judged as a misfire caused by noiseless discharge or fuel supply deficiency. When the integrated value AD1 at the window W1 is LARGE, the integrated value AD2 at the window W2 is LARGE, the integrated value AD3 at the window W3 is LARGE, and the integrated value AD4 at the window W4 is SMALL, the combustion condition is judged as knocking. As above described, the combustion condition is judged from a combination of each of the integrated values AD1, AD2, ... at a plurality of windows W1, W2, . . . , and accordingly, the judgement error can be remarkably decreased.

In the above example, the judgement of LARGE, MEDIUM, and SMALL on the each integrated values AD1, AD2, ... are performed as illustrated in FIG. 10. For example, initially it is judged whether the input of the $(i+m-1)$th integrated value AD3 is finished or not (step 710), and the processing advances to the step 720 when the input is judged as being finished. At the step 720, m values of the integrated value AD3 are summed up, and divided by m for obtaining an average value P. At the step 730, a first comparative value (in the present example $k_1P$), which is a function of the average value, is compared with the integrated value $AD3(i+m-1)$, and when the integrated value $AD3(i+m-1)$ is smaller than the first comparative value $k_1P$, the processing advances to the step 750, and the integrated value $AD3(i+m-1)$ is judged as SMALL. When the integrated value $AD3(i+m-1)$ is larger than the first comparative value $k_1P$ at the step 730, the processing advances to the step 740, and the integrated value $AD3(i+m-1)$ is compared with the second comparative value (in the present example $k_2P$). When the integrated value $AD3(i+m-1)$ is smaller than the second comparative value $k_2P$, the processing advances to the step 770, and the integrated value $AD3(i+m-1)$ is judged as MEDIUM. When the integrated value $AD3(i+m-1)$ is larger than the second comparative value $k_2P$ at the step 740, go to the step 760, and the integrated value $AD3(i+m-1)$ is judged as LARGE. At the step 780, i is increased by one increment and A/D conversion of the next integrated value is waited for. Besides, judgement of each of the integrated values AD1, AD2, . . . for LARGE, MEDIUM, and SMALL can be performed by, for example, the maximum value, the minimum value, or the predetermined value in addition to the average value of the integrated value.

The result of the diagnosis is displayed on the display apparatus 15 with the designated cylinder number. The operator performs adjustments etc. while watching the display. In the display, not only the combustion condition, but also causes of misfire are indicated, and accordingly, adequate adjustment can be performed.

And, it is preferable that when displaying the result of the diagnosis, the frequencies of the various kinds of detected combustion conditions are stored in respective storage locations of the RAM 53 for each kind of combustion condition, and only the result as to the judgement of which frequency exceeds a value predetermined for each kind of combustion condition or a value defined by a predetermined function among the frequencies of the various kinds of combustion conditions is preferably displayed on the display apparatus 15. In accordance with the above described method, almost all erroneous displays can be prevented. As for the predetermined function in the above described method, taking a case of misfire for example, a function which makes the defined value of the frequency lower when the oxygen concentration increases is preferably used because the oxygen concentration in the exhaust gas increases when a misfire occurs.

In accordance with the above described combustion condition diagnosis, various judgements are performed based on the integrated value of the values in the windows, but the present invention is not restricted to the above described method, and any value which expresses a feature of the voltage in the window can be usable. For example, a judgement can be performed based on the maximum value, the minimum value, the average value, and the voltage wave shape in the windows. When the maximum value, the minimum value, and the average value in the windows are used, the processing circuit 14 is required to be composed, for example, in a manner as illustrated in FIG. 6.

Figure 6:
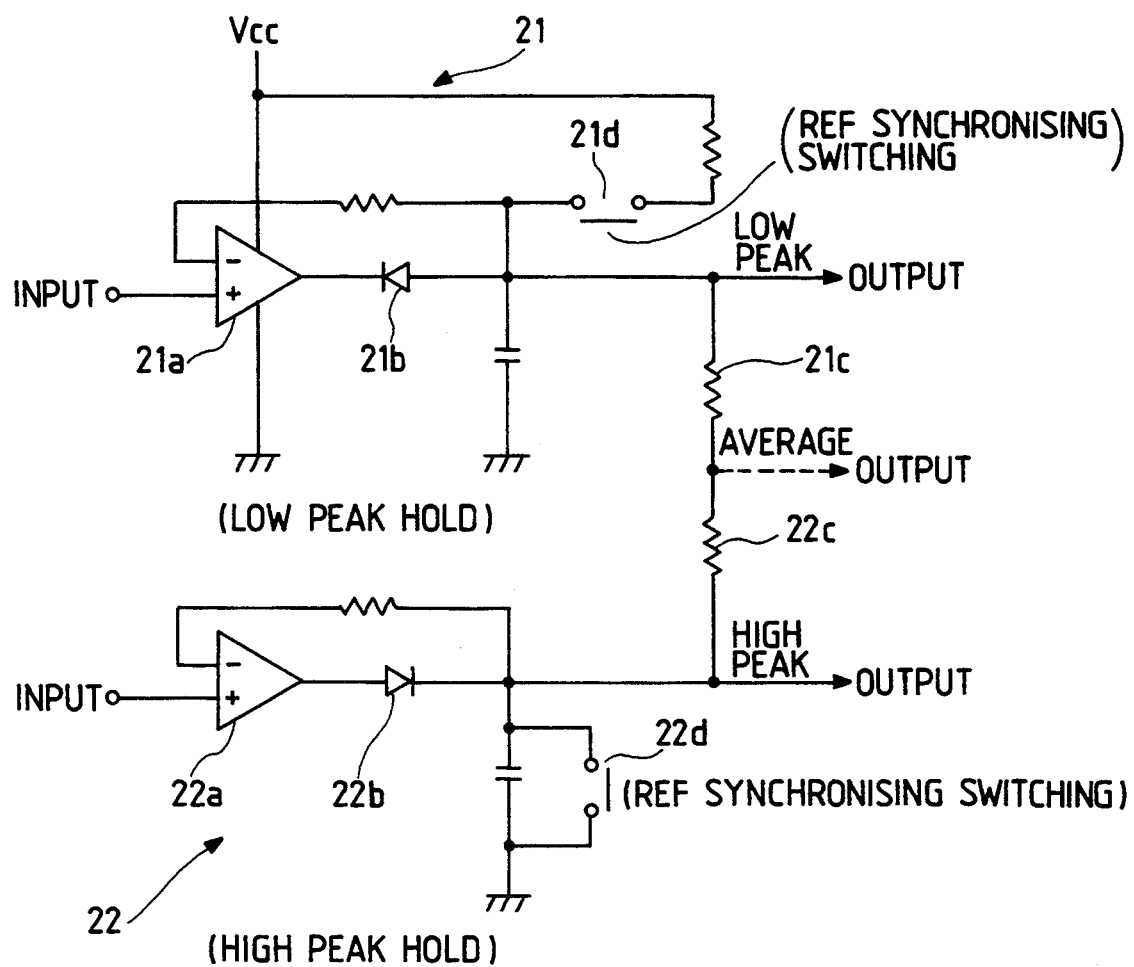
FIG. 6 is a circuit diagram of another processing circuit relating to an embodiment of the present invention.

The processing circuit illustrated in FIG. 6 comprises a low peak voltage hold circuit 21 and a high peak voltage hold circuit 22 in addition to the window generation circuit 20. The low peak voltage hold circuit 21 comprises an operation amplifier 21a in which signals from output terminal 10e of the ionic current detecting circuit 10 are input, the diode 21b, and the switch 21d. And, the high peak voltage hold circuit 22 comprises an operational amplifier 22a in which signals from output terminal 10e of the ionic current detecting circuit 10 are input, the diode 22b of which the current direction is reverse to that of the diode in the low peak voltage hold circuit 21, and the switch 22d. Output terminals of the low peak voltage hold circuit 21 and the high peak voltage hold circuit 22 are connected, respectively, through the resistors 21c and 22c, and an average value is output from the connected terminal. The switches 21d and 22d are for discharging of the held low peak voltage and the held high peak voltage.

Figure 7:
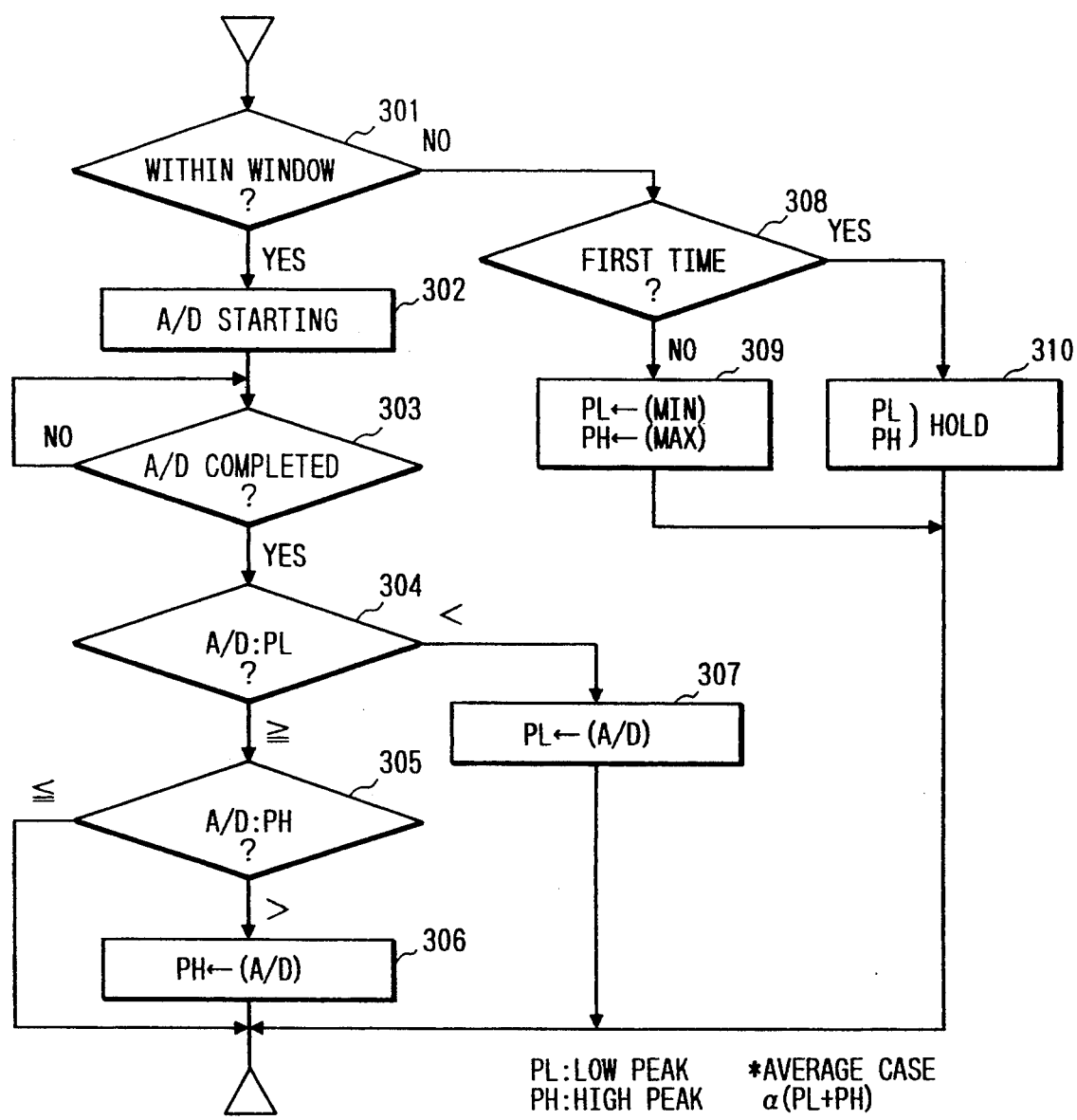
FIG. 7 is a flow chart indicating another routine for processing of signals from an ionic current detecting circuit relating to an embodiment of the present invention.

The above described processing circuit can be implemented in software along with the processing circuit 14. Referring to FIG. 7, it is judged at the step 301 whether the input signal is within the window or not. If it is within the window, the processing advances to the step 302 and A/D conversion is initiated. Finishing of the A/D conversion is confirmed at the step 303, and the processing advances to the step 304 after completion of the conversion. At the step 304, the A/D converted value is compared with a registered low peak value, and when the A/D converted value is smaller than the registered low peak value, the A/D converted value is taken as a new low peak value at the step 307. When it is found that the A/D converted value is larger at the step 304, the processing advances to the step 305 and the value is compared with a registered high peak value. When it is found that the A/D converted value is larger than the high peak value, the processing advances to the step 306 and the A/D converted value is taken as a new high peak value.

When the signal is judged as outside of the window at the step 301, the processing advances to the step 308, and it is determined whether the signal is passing for the first time or second or more. If it is passing for the first time, both the high peak value and low peak value are held at the step 310. If it is the second time or more, both the high peak value and the low peak value are reset at the step 309. The average value is obtained by dividing the sum of the high peak value and the low peak value with 2.

The above described embodiment is related to the diagnosis for combustion condition of an engine, but further, an apparatus for combustion control utilizing the result of the diagnosis for combustion control can be developed.

That is, when the diagnosis judges that a misfire is occurring, the fuel supply to the misfiring cylinder is cut off and a signal on judging the fuel to air ratio from the oxygen sensor 6a is shifted to a diluted value. The reason for the above processing is that the cutting off of fuel supply to the misfiring cylinder will cause lowering of observed values from the oxygen sensor 6a which is measuring oxygen concentration at a gathering portion of exhaust gas from each of the cylinders. When the diagnosis judges knocking is occurring, the ignition timing is delayed or the fuel concentration is increased. The above described control can be performed by previously storing software programs for control depending on the combustion conditions in the ROM 52, executing the stored programs by the CPU 51, and changing the ignition timing signals IGN and fuel injection signals INJ in response to detected combustion conditions.

What is claimed is;

1. An apparatus for combustion condition diagnosis, comprising:

voltage supplying means for applying a predetermined voltage to an ignition plug disposed in a combustion chamber;

measuring means, to be connected to a secondary side of an ignition coil which is connected to said ignition plug, for measuring an electric current flowing through said ignition plug during a plurality of successive time periods during one operation cycle, including a time period in which an internal pressure of said combustion chamber becomes maximum under a normal combustion condition;

feature extracting means for extracting features of the electric current measured in each of said time periods;

memory means for storing a list of combustion conditions corresponding to said features extracted in each of said time periods; and combustion condition judging means for diagnosing a combustion condition in said combustion chamber based on said features extracted in each of said time periods and said list of combustion conditions stored in said memory means.

2. An apparatus for combustion condition diagnosis, comprising:

voltage supplying means for applying a predetermined voltage to an ignition plug immediately after sparking of said ignition plug;

measuring means for measuring a voltage at a secondary side of an ignition coil, which is connected to said ignition plug, during a plurality of successive time periods during one operation cycle, including a time period in which an internal pressure of a combustion chamber in which the spark plug is disposed becomes maximum under a normal combustion condition and a time period in which charging of a voltage to a primary side of the ignition coil is initiated;

feature extracting means for extracting features of the voltage measured in each of said time periods;

memory means for storing a list of combustion conditions corresponding to said features extracted in each of said time periods; and combustion condition judging means for diagnosing a combustion condition in said cylinder based on said features extracted in each of said time periods and said list of combustion conditions stored in said memory means.

3. An apparatus for combustion condition diagnosis as claimed in claims 1 or 2, wherein said plurality of time periods additionally include at least one of:

a time period in which the sparking of the spark plug is terminated under a normal combustion condition; and a time period which occurs a predetermined time after the time when the internal pressure of the combustion chamber becomes maximum under a normal combustion condition.

4. An apparatus for combustion condition diagnosis as claimed in claim 3, wherein said features are integrated values occurring during a predetermined time period.

5. An apparatus for combustion condition diagnosis as claimed in claim 4, further comprising:

display means for display of a diagnosis result by said combustion condition judging means.

6. An apparatus for combustion condition diagnosis as claimed in claim 5, further comprising:

frequency memory means for storing frequencies of occurrence of various kinds of combustion conditions for each kind of combustion condition diagnosed by said combustion condition judging means; and display command means for commanding said display means to display said diagnosis result relating to only a combustion condition which has a frequency of occurrence which exceeds a predetermined value or a value defined by a predetermined condition among frequencies of occurrence of said various kinds of combustion condition.

7. An apparatus for combustion condition diagnosis, comprising:

combustion condition judging means for diagnosing various kinds of combustion conditions of an engine on the basis of a plurality of values of current flowing through a spark plug as detected during respective time periods in one operation cycle of the spark plug;

frequency memory means for storing frequencies of occurrence of the various kinds of combustion conditions diagnosed by said combustion condition judging means, respectively; and display means for displaying results of diagnosis relating to only a combustion condition which has a frequency of occurrence which exceeds a predetermined value or a value defined by a predetermined function assigned respectively to each kind of combustion condition among frequencies of occurrence of said various kinds of combustion conditions.

8. A method of combustion condition diagnosis comprising the steps of;

applying a predetermined voltage to an ignition plug installed in a combustion chamber at least immediately after sparking of said ignition plug;

measuring a voltage or electric current at said ignition plug to which said predetermined voltage is applied during a plurality of successive time periods during one operation cycle, including a time period in which an internal pressure in said combustion chamber becomes maximum under a normal combustion condition;

extracting features of said voltage or electric current measured in each time period; and diagnosing combustion condition of an engine based on the features extracted during each time period.

9. A method of combustion condition diagnosis comprising the steps of;

diagnosing various kinds of combustion conditions of an engine on the basis of a plurality of values of current flowing through a spark plug as detected during respective time periods in one operation cycle of the spark plug;

storing frequencies of occurrence of various kinds of diagnosed combustion conditions for each kind of combustion condition, respectively; and displaying results of the diagnosis relating to only a combustion condition which has a frequency of occurrence which exceeds a predetermined value or a value defined by a predetermined function assigned respectively to each kind of combustion condition among frequencies of occurrence of said various kinds of combustion conditions.

10. A combustion control apparatus, comprising:

voltage supplying means for applying a predetermined voltage to an ignition plug disposed in a combustion chamber;

measuring means, to be connected to a secondary side of an ignition coil which is connected to said ignition plug, for measuring an electric current flowing through said ignition plug during a plurality of successive time periods during one operation cycle, including a time period in which an internal pressure of said combustion chamber becomes maximum under a normal combustion condition;

feature extracting means for extracting features of the electric current measured in each of said time periods;

memory means for storing a list of combustion conditions corresponding to said features extracted in each of said time periods;

combustion condition judging means for diagnosing a combustion condition in said combustion chamber based on said features extracted in each of said time periods and said list of combustion conditions stored in said memory means; and control means for altering various controlled variables of an engine corresponding to various combustion conditions diagnosed by said combustion condition judging means.

11. An apparatus for combustion condition diagnosis as claimed in claim 10, wherein said plurality of time periods additionally include at least one of:

a time period in which the sparking of the spark plug is terminated under a normal combustion condition; and a time period which occurs a predetermined time after the time when the internal pressure of the combustion chamber becomes maximum under a normal combustion condition.

12. An apparatus for combustion condition diagnosis as claimed in claim 11, wherein said features are integrated values occurring during a predetermined time period.

13. An apparatus for combustion condition diagnosis as claimed in claim 12, further comprising:

display means for display of a diagnosis result by said combustion condition judging means.

14. An apparatus for combustion condition diagnosis as claimed in claim 13, further comprising:

frequency memory means for storing frequencies of occurrence of various kinds of combustion conditions for each kind of combustion condition diagnosed by said combustion condition judging means; and display command means for commanding said display means to display said diagnosis result relating to only a combustion condition which has a frequency of occurrence which exceeds a predetermined value or a value defined by a predetermined condition among frequencies of occurrence of said various kinds of combustion condition.

15. A combustion control apparatus, comprising:

voltage supplying means for applying a predetermined voltage to an ignition plug immediately after sparking of said ignition plug;

measuring means for measuring a voltage at a secondary side of an ignition coil, which is connected to said ignition plug, during a plurality of successive time periods during one operation cycle, including a time period in which an internal pressure of a combustion chamber in which the spark plug is disposed becomes maximum under a normal combustion condition and a time period in which charging of a voltage to a primary side of the ignition coil is initiated;

feature extracting means for extracting features of the voltage measured in each of said time periods;

memory means for storing a list of combustion conditions corresponding to said features extracted in each of said time periods;

combustion condition judging means for diagnosing a combustion condition in said cylinder based on said features extracted in each of said time periods and said list of combustion conditions stored in said memory means; and control means for altering various controlled variables of an engine corresponding to various combustion conditions diagnosed by said combustion condition judging means.

16. An apparatus for combustion condition diagnosis as claimed in claim 15, wherein said plurality of time periods additionally include at least one of:
   a time period in which the sparking of the spark plug is terminated under a normal combustion condition; and
   a time period which occurs a predetermined time after the time when the internal pressure of the combustion chamber becomes maximum under a normal combustion condition.

17. An apparatus for combustion condition diagnosis as claimed in claim 16, wherein said features are integrated values occurring during a predetermined time period.

18. An apparatus for combustion condition diagnosis as claimed in claim 17, further comprising:
   display means for display of a diagnosis result by said combustion condition judging means.

19. An apparatus for combustion condition diagnosis as claimed in claim 18, further comprising:
   frequency memory means for storing frequencies of occurrence of various kinds of combustion conditions for each kind of combustion condition diagnosed by said combustion condition judging means; and
   display command means for commanding said display means to display said diagnosis result relating to only a combustion condition which has a frequency of occurrence which exceeds a predetermined value or a value defined by a predetermined condition among frequencies of occurrence of said various kinds of combustion condition.

20. An apparatus for combustion condition diagnosis, comprising:
   voltage supplying means for applying a predetermined voltage to an ignition plug disposed in a combustion chamber immediately after the ignition plug fires;
   measuring means for measuring an electric current flowing through said ignition plug during a plurality of successive time periods during one operation cycle, including a time period in which an internal pressure of said combustion chamber becomes maximum under a normal combustion condition; and
   combustion condition judging means for diagnosing a combustion condition in said combustion chamber based on the values of electric current measured in said plurality of successive time periods.

21. An apparatus for combustion condition diagnosis as claimed in claim 20, wherein said plurality of time periods additionally include at least one of:
   a time period in which the sparking of the spark plug is terminated under a normal combustion condition; and
   a time period which occurs a predetermined time after the time when the internal pressure of the combustion chamber becomes maximum under a normal combustion condition.

22. An apparatus for combustion condition diagnosis as claimed in claim 20, wherein said measuring means measures said electric current flowing through said spark plug by detecting a voltage generated across a resistance connected in a circuit with said spark plug.

* * * * *